(12) United States Patent
Kramer, Jr.

(10) Patent No.: US 9,605,911 B1
(45) Date of Patent: Mar. 28, 2017

(54) BEVERAGE COOLING SYSTEM

(71) Applicant: Jack G. Kramer, Jr., Tampa, FL (US)

(72) Inventor: Jack G. Kramer, Jr., Tampa, FL (US)

( * ) Notice: Subject to any disclaimer, the term of this patent is extended or adjusted under 35 U.S.C. 154(b) by 150 days.

(21) Appl. No.: 13/716,679

(22) Filed: Dec. 17, 2012

(51) Int. Cl.
| | | |
|---|---|---|
| *F28F 9/00* | (2006.01) | |
| *F28F 21/08* | (2006.01) | |
| *H01L 23/367* | (2006.01) | |
| *F28F 3/02* | (2006.01) | |
| *F25D 31/00* | (2006.01) | |

(52) U.S. Cl.
CPC ........... *F28F 9/00* (2013.01); *F28F 21/08* (2013.01); *F25D 31/002* (2013.01); *F25D 31/003* (2013.01); *F25D 2331/808* (2013.01); *F28F 3/02* (2013.01); *H01L 23/3672* (2013.01)

(58) Field of Classification Search
CPC .. H01L 23/3672; F28F 3/02; F25D 2331/808; F25D 31/002; F25D 31/003
USPC ............ 165/185; 84/422.4; 62/293; 366/129
See application file for complete search history.

(56) References Cited

U.S. PATENT DOCUMENTS

| | | | | |
|---|---|---|---|---|
| 1,944,726 | A * | 1/1934 | Aiken .......................... 62/293 |
| 2,462,757 | A * | 2/1949 | Loycz .......................... 62/130 |
| 2,613,107 | A * | 10/1952 | Hartnett ....................... 239/33 |
| 2,688,467 | A * | 9/1954 | Leatzow ....................... 165/67 |
| 4,607,685 | A * | 8/1986 | Mitchell, Jr. ................ 165/80.3 |
| 4,621,387 | A * | 11/1986 | Noser ........................ 15/167.1 |
| 4,660,132 | A * | 4/1987 | Basler et al. ................ 362/294 |
| 4,735,063 | A * | 4/1988 | Brown ......................... 62/293 |
| 4,761,314 | A * | 8/1988 | Marshall ...................... 428/11 |
| 5,235,823 | A * | 8/1993 | Coker ......................... 62/530 |
| D356,067 | S * | 3/1995 | Itoh ............................ D13/179 |
| 5,421,406 | A * | 6/1995 | Furusawa et al. ............ 165/185 |
| 5,441,716 | A * | 8/1995 | Rockenfeller ............... 423/299 |
| D367,504 | S * | 2/1996 | Barzani ...................... D21/498 |
| 5,601,003 | A * | 2/1997 | Amtenbrink et al. ......... 81/489 |
| 5,726,495 | A * | 3/1998 | Aihara et al. ................ 257/722 |
| 6,103,081 | A * | 8/2000 | Morris et al. ................ 204/451 |
| 6,218,607 | B1 * | 4/2001 | Mulligan et al. ............ 136/253 |
| 6,397,931 | B1 * | 6/2002 | Lin ........................ F28F 3/027 165/185 |
| 6,655,240 | B1 * | 12/2003 | DeVecchis et al. ........... 81/438 |
| D488,339 | S * | 4/2004 | Lee ............................ D7/300.2 |
| D505,981 | S * | 6/2005 | Lin ............................ D21/484 |
| 7,578,611 | B2 * | 8/2009 | Hamilton ..................... 366/129 |
| D603,502 | S * | 11/2009 | Petersen ..................... D24/133 |
| 8,267,573 | B2 * | 9/2012 | Wilson ........................ 366/200 |
| 2002/0075752 | A1* | 6/2002 | Lane ........................... 366/129 |
| 2004/0244563 | A1* | 12/2004 | Calato ........................ 84/422.4 |
| 2005/0160523 | A1* | 7/2005 | Bixby ........................ 4/255.01 |
| 2008/0196434 | A1* | 8/2008 | Spratley ....................... 62/293 |
| 2008/0216988 | A1* | 9/2008 | Cerra et al. ................... 165/67 |
| 2008/0245293 | A1* | 10/2008 | Fosmire et al. ............... 118/13 |
| 2010/0220440 | A1* | 9/2010 | Sun ........................ 361/679.54 |
| 2011/0062168 | A1* | 3/2011 | Chow et al. ................. 220/705 |

* cited by examiner

*Primary Examiner* — Jianying Atkisson
*Assistant Examiner* — Joel Attey

(57) ABSTRACT

A heat transfer member fabricated of a thermally conductive material has a curved exterior surface with a central axis and is formed with an axial aperture and annular exterior fins with parallel spaces between the fins. A handle member is fabricated of a thermally insulating material. A coupling member has a cylindrical configuration and has a first end removably received in the aperture of the heat transfer member and has a second end coupled to the handle member.

2 Claims, 4 Drawing Sheets

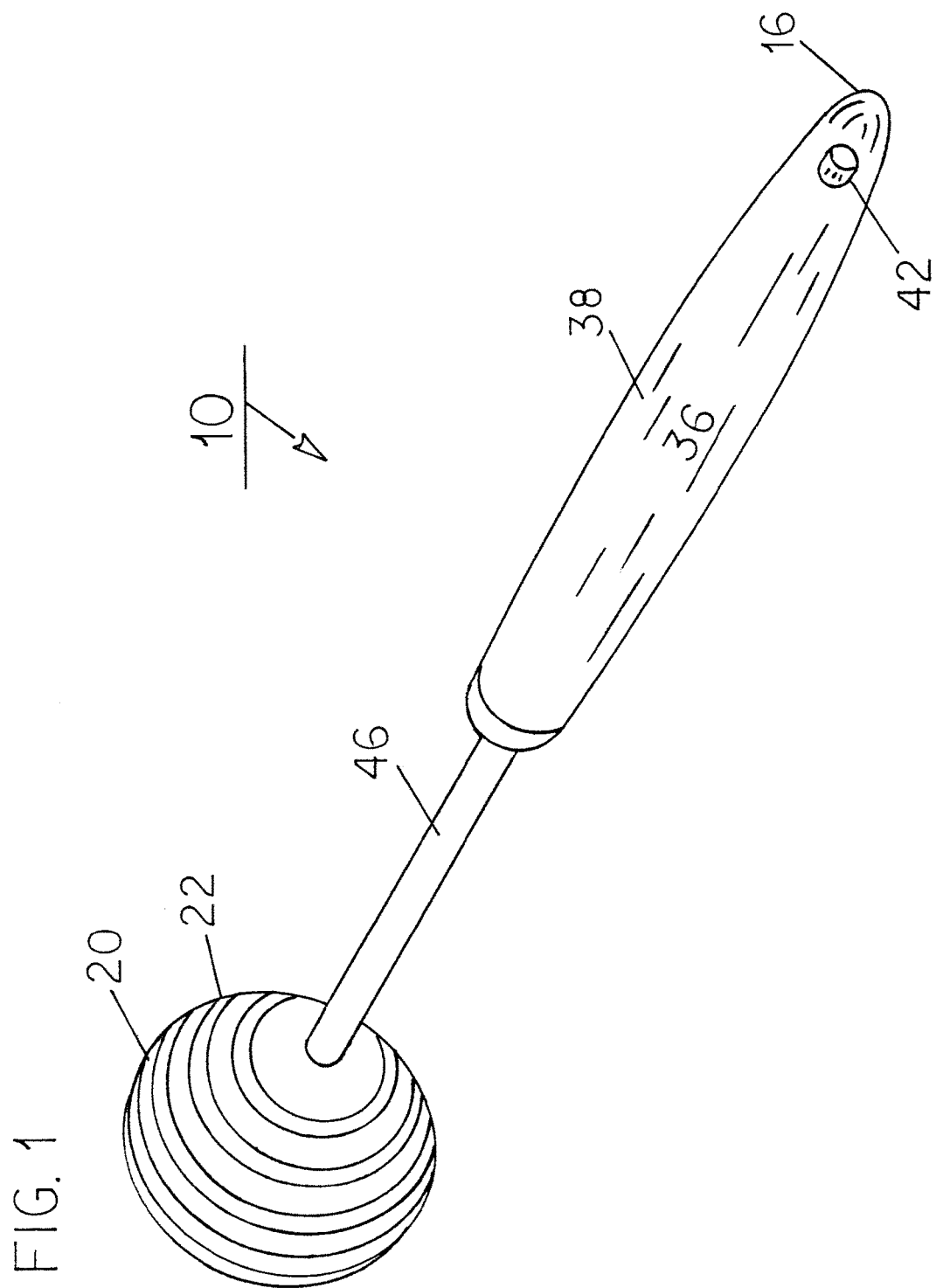

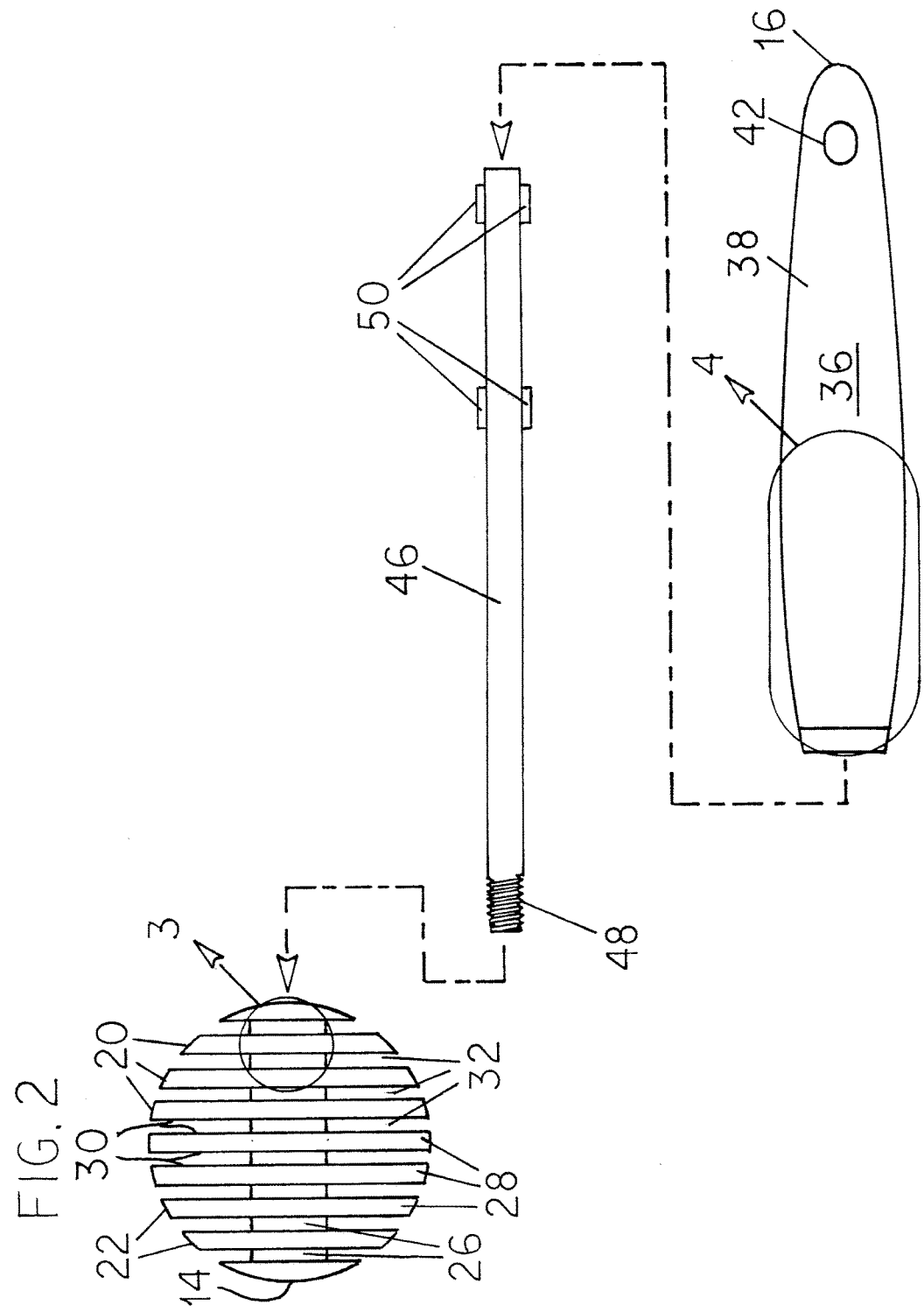

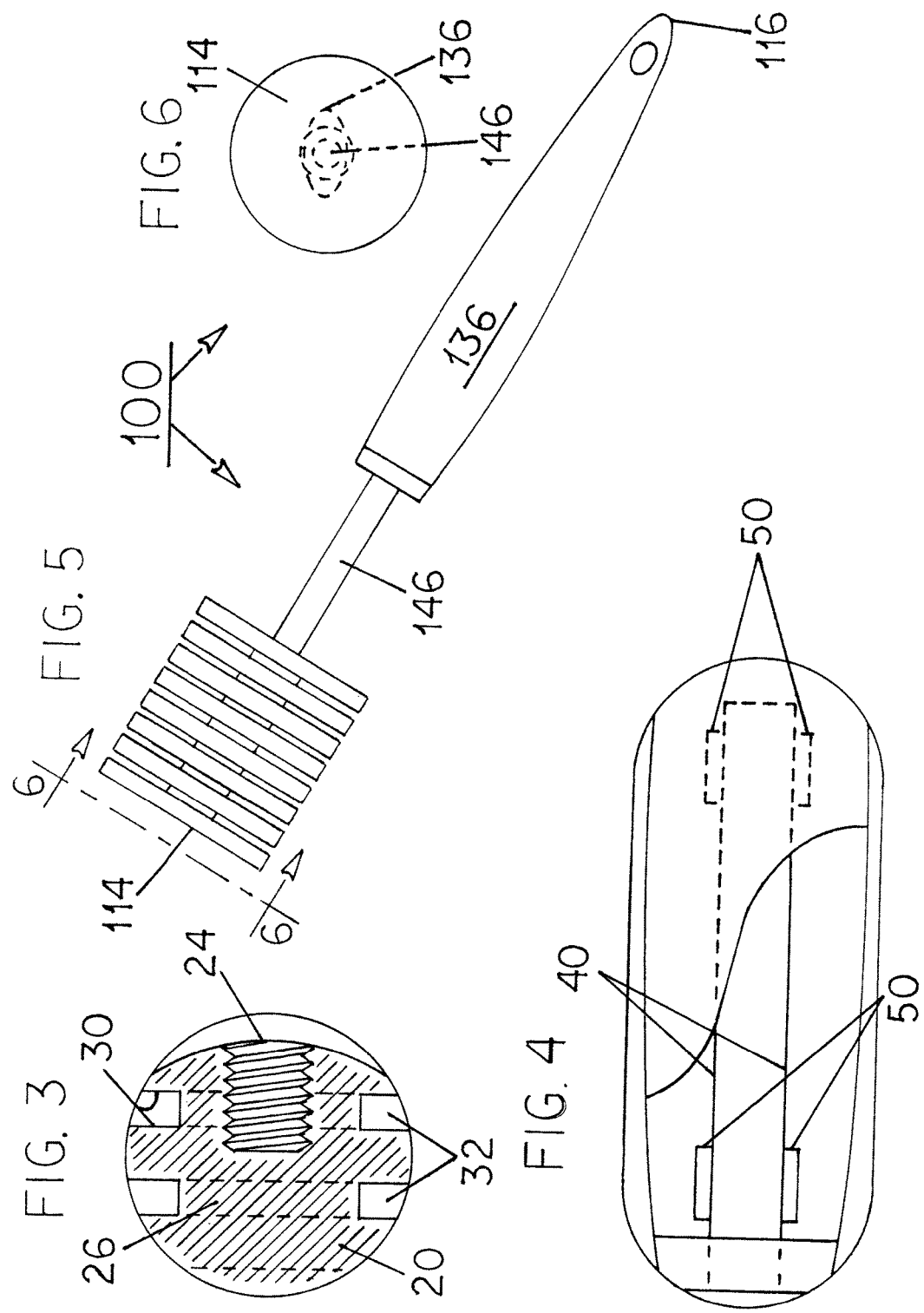

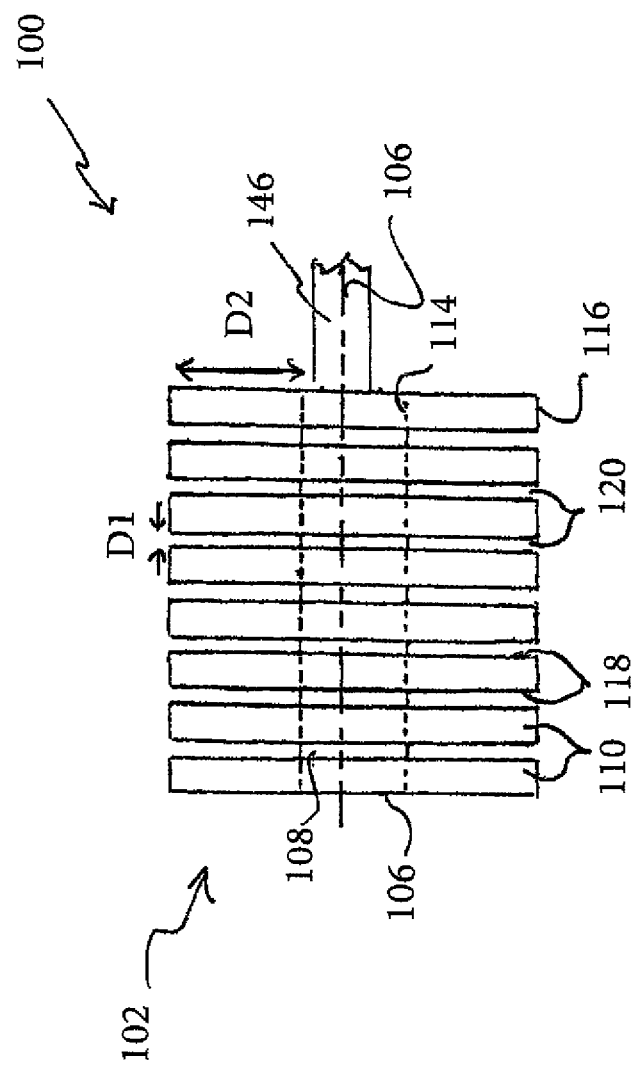

BEVERAGE COOLING SYSTEM

BACKGROUND OF THE INVENTION

Field of the Invention

The present invention relates to a beverage cooling system and more particularly pertains to positioning the system in a hot liquid beverage, transferring heat energy from a hot liquid beverage to the system and cooling the beverage to an appropriately reduced drinking temperature, the positioning of the system and transferring and cooling being done in a safe, convenient and economical manner.

Description of the Prior Art

The use of beverage cooling systems of known designs and configurations is known in the prior art. More specifically, beverage cooling systems of known designs and configurations previously devised and utilized for the purpose of cooling hot beverages are known to consist basically of familiar, expected, and obvious structural configurations, notwithstanding the myriad of designs encompassed by the crowded prior art which has been developed for the fulfillment of countless objectives and requirements.

While these devices fulfill their respective, particular objectives and requirements, they do not describe a beverage cooling system that allows positioning the system in a hot liquid beverage and transferring heat energy from the hot liquid beverage to the system and cooling the beverage to an appropriately reduced drinking temperature, the positioning of the system and transferring and cooling being done in a safe, convenient and economical manner.

In this respect, the beverage cooling system according to the present invention substantially departs from the conventional concepts and designs of the prior art, and in doing so provides an apparatus primarily developed for the purpose of positioning the system in a hot liquid beverage and transferring heat energy from the hot liquid beverage to the system and cooling the beverage to an appropriately reduced drinking temperature, the positioning of the system and transferring and cooling being done in a safe, convenient and economical manner.

Therefore, it can be appreciated that there exists a continuing need for a new and improved beverage cooling system which can be used for positioning the system in a hot liquid beverage and transferring heat energy from the hot liquid beverage to the system and cooling the beverage to an appropriately reduced drinking temperature, the positioning of the system and transferring and cooling being done in a safe, convenient and economical manner. In this regard, the present invention substantially fulfills this need.

SUMMARY OF THE INVENTION

In view of the disadvantages inherent in the known types of beverage cooling systems of known designs and configurations now present in the prior art, the present invention provides an improved beverage cooling system. As such, the general purpose of the present invention, which will be described subsequently in greater detail, is to provide a new and improved beverage cooling system and method which has all the advantages of the prior art and none of the disadvantages.

To attain this, the present invention essentially comprises a heat transfer member fabricated of a thermally conductive material having a curved exterior surface with a central axis and formed with an axial aperture and annular exterior fins with parallel spaces between the fins. A handle member is fabricated of a thermally insulating material. A coupling member has a cylindrical configuration and has a first end removably received in the aperture of the heat transfer member and has a second end coupled to the handle member.

There has thus been outlined, rather broadly, the more important features of the invention in order that the detailed description thereof that follows may be better understood and in order that the present contribution to the art may be better appreciated. There are, of course, additional features of the invention that will be described hereinafter and which will form the subject matter of the claims attached.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of descriptions and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

It is therefore an object of the present invention to provide a new and improved beverage cooling system which has all of the advantages of the prior art beverage cooling systems of known designs and configurations and none of the disadvantages.

It is another object of the present invention to provide a new and improved beverage cooling system which may be easily and efficiently manufactured and marketed.

It is further object of the present invention to provide a new and improved beverage cooling system which is of durable and reliable constructions.

An even further object of the present invention is to provide a new and improved beverage cooling system which is susceptible of a low cost of manufacture with regard to both materials and labor, and which accordingly is then susceptible of low prices of sale to the consuming public, thereby making such beverage cooling system economically available to the buying public.

Lastly, it is still another object of the present invention is to provide a beverage cooling system for positioning the system in a hot liquid beverage and transferring heat energy from the hot liquid beverage to the system and cooling the beverage to an appropriately reduced drinking temperature, the positioning of the system and transferring and cooling being done in a safe, convenient and economical manner.

These together with other objects of the invention, along with the various features of novelty which characterize the invention, are pointed out with particularity in the claims annexed to and forming a part of this disclosure.

For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 1 is a perspective illustration of a beverage cooling system constructed in accordance with the principles of the present invention.

FIG. 2 is an exploded front elevational view of the system shown in FIG. 1.

FIG. 3 is an enlarged cross sectional view showing a portion of the system taken at Circle 3 of FIG. 2.

FIG. 4 is an enlarged cross sectional view showing a portion of the system taken at Oval 3 of FIG. 2.

FIG. 5 is a front elevational view of a beverage cooling system constructed in accordance with an alternate embodiment of the invention.

FIG. 6 is an end elevational view taken at line 6-6 of FIG. 5.

FIG. 7 is an enlarged illustration of the heat transfer member shown in FIG. 5.

The same reference numerals refer to the same parts throughout the various Figures.

DESCRIPTION OF THE PREFERRED EMBODIMENT

With reference now to the drawings, and in particular to FIG. 1 thereof, the preferred embodiment of the new and improved beverage cooling system embodying the principles and concepts of the present invention and generally designated by the reference numeral 10 will be described.

The present invention, the beverage cooling system 10 is comprised of a plurality of components. Such components in their broadest context include a heat transfer end, a handle member, and a coupling member. Such components are individually configured and correlated with respect to each other so as to attain the desired objective.

The beverage cooling system 10 of the present invention is for positioning in a cup of hot liquid beverage, coffee, tea, cocoa and like hot liquid beverages, for transferring heat energy from the hot liquid beverage to the system, and for cooling the beverage to an appropriately reduced drinking temperature. The positioning and transferring and cooling are done in a safe, convenient and economical manner.

First provided is a heat transfer member 20 constituting a distal end 14 of the system. The heat transfer member has a generally spherical exterior surface 22 with a diameter of 2 inches plus or minus 10 percent and a central axis. The heat transfer member is formed with a threaded aperture 24 having a diameter of 0.25 inches plus or minus 10 percent and a length of 0.5 inches plus or minus 10 percent in an axial orientation. The heat transfer member is fabricated of aluminum in a one-piece construction. The heat transfer member is formed with an interior cylindrical core 26 having a diameter of 0.5 inches plus or minus 10 percent and a core axis coextensive with the central axis. The heat transfer member is formed with annular exterior fins 28 extending radially from the interior cylindrical core. Each exterior fin has parallel faces 30 perpendicular to the central axis spaced by a fin thickness of 0.125 inches plus or minus 10 percent. The fins form annular parallel spaces 32 perpendicular to the central axis spaced by 0.125 inches plus or minus 10 percent. The fins have radial ends forming the exterior surface of the heat transfer member.

Next provided is a handle member 36 constituting a proximal end 16 of the system. The handle member has a generally ergonomically-shaped gripping surface 38 with a central axis, a length of 4.75 inches plus or minus 10 percent, and a maximum diameter of 0.75 inches plus or minus 10 percent. The handle member is formed with an un-threaded axial recess 40 having a diameter of 0.25 inches plus or minus 10 percent and a length of 3.5 inches plus or minus 10 percent. A hole 42 is provided in the handle member remote from the un-threaded axial recess. The handle member is molded of plastic in a one-piece construction.

Lastly, a coupling member 46 constituting an intermediate extent of the system is provided. The coupling member has a cylindrical configuration with a central axis, a diameter of 0.25 inches plus or minus 10 percent, and a length of 5.25 inches plus or minus 10 percent. The coupling member is formed with a threaded end 48 removably received in the threaded aperture of the heat transfer member. The threaded end has a length of 0.5 inches plus or minus 10 percent in an axial orientation. The coupling member has an un-threaded end molded into the un-threaded recess of the handle member. The coupling member has rectangular projections 50 extending radially remote from the threaded end to abate rotation of the handle with respect to the coupling member and the heat transfer member. The coupling member including the projections are fabricated of aluminum.

An alternate embodiment of the system 100 is shown in FIGS. 5 and 6. In the embodiment, the heat transfer member constitutes a distal end 114 of the system and is fabricated of aluminum in a cylindrical configuration. Also, the handle member 136 constitutes a proximal end 116 of the system and is fabricated of plastic. Finally, the coupling member 146 is threadedly coupled to the heat transfer member.

FIG. 7 illustrates in greater detail the cylindrical embodiment. Such embodiment includes the coupling member 146 which supports the heat transfer member 102 at the distal end 116 of the system 100. The heat transfer member has a central axis 106. The heat transfer member also includes a core 108 in a cylindrical configuration with an axis coextensive with the central axis. A plurality of similarly configured cylindrical fins 110, eight in the preferred embodiment, is next provided. Each cylindrical fin is formed in an annular configuration. Each cylindrical fin has an interior cylindrical surface 114 supported on the core. Each cylindrical fin has an exterior cylindrical surface 118 concentric with the interior cylindrical surface. Each fin has two planar faces 120. A plurality of annular spacings 120, seven in the preferred embodiment, are axially spaced along the core by an axial distance D1 parallel with the central axis. The seven annular spacings are formed by a radial depth D2 perpendicular to the central axis and extending between the interior and exterior cylindrical surfaces. The radial depth D2 is several times greater than the axial distance D1.

In use, the entirety of the fins is positioned in a cup of hot beverage to the cooled for maximum efficiency with the heat transfer member supported below on the bottom of the cup containing the beverage and with the coupling component at an angle from the vertical in contact above with the lip of the cup. When the system is stored in a freezer, the cooling time for the beverage is about 5 seconds. From a refrigerator or from room temperature, it is advisable to swirl the system in the beverage for a few seconds, then run the system under cold water and then repeat the swirling one or more times. This will accomplish the cooling task in under 30 seconds. The shape of the fins and the spaces of the heat transfer member as well as the material are the result of extended research and development which provide for a surprising and extremely rapid beverage cooling.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the United States is as follows:

1. A beverage cooling system comprising:
   a heat transfer member constituting a distal end of the system, the heat transfer member having a cylindrical exterior surface with a diameter with a central axis, the heat transfer member being formed with a threaded aperture having a diameter and a length in an axial orientation, the heat transfer member being fabricated of metal, the heat transfer member being formed with an interior cylindrical core having a diameter with a core axis coextensive with the central axis, the heat transfer member being formed with annular exterior fins extending radially from the interior cylindrical core, each exterior fin having parallel faces perpendicular to the central axis spaced by a fin thickness, the fins forming annular parallel spaces perpendicular to the central axis spaced, the fins having radial ends forming the exterior surface of the heat transfer member;
   a handle member constituting a proximal end of the system, the handle member having a gripping surface with a central axis and a length and a maximum diameter, the handle member being formed with an axial recess having a diameter and a length, the handle member including a hole there through remote from the axial recess, the handle member being molded of plastic and
   a coupling member constituting an intermediate extent of the system, the coupling member having a cylindrical configuration with a central axis and a diameter, the coupling member being formed with a threaded end removably received in the threaded aperture of the heat transfer member, the threaded end having a length in an axial orientation, the coupling member being coupled to the recess of the handle member, the coupling member having projections extending radially remote from the threaded end to abate rotation of the handle with respect to the coupling member and the heat transfer member, the coupling member including the projections being fabricated of aluminum,
   the system (100) including the coupling member (146) supporting the heat transfer member (102) at the distal end (116) of the system (100), the heat transfer member having a central axis (106), the heat transfer member also including the core (108) in a cylindrical configuration with an axis coextensive with the central axis, a plurality of similarly configured cylindrical fins 110, each cylindrical fin being formed in an annular configuration, each cylindrical fin having an interior cylindrical surface (114) supported on the core, each cylindrical fin having an exterior cylindrical surface (118) concentric with the interior cylindrical surface, each fin having two planar faces (120), a plurality of annular spacings (120) axially spaced along the core by an axial distance D1 parallel with the central axis, the plurality of annular spacings forming a radial depth D2 perpendicular to the central axis and extending between the interior and exterior cylindrical surfaces, the radial depth D2 being several times greater than the axial distance D1.

2. A beverage cooling system (10) for positioning in a cup of hot liquid beverage, coffee, tea, cocoa and like hot liquid beverages, and for transferring heat energy from the hot liquid beverage to the system, and for cooling the beverage to an appropriately reduced drinking temperature, the positioning and transferring and cooling being done in a safe, convenient and economical manner, the system comprising:
   a heat transfer member (20) constituting a distal end (14) of the system, the heat transfer member having a generally cylindrical exterior surface (22) with a diameter of 2 inches plus or minus 10 percent and with a central axis, the heat transfer member being formed with a threaded aperture (24) having a diameter of 0.25 inches plus or minus 10 percent and a length in an axial orientation, the heat transfer member being fabricated of aluminum in a one-piece construction, the heat transfer member being formed with an interior cylindrical core (26) having a diameter of 0.5 inches plus or minus 10 percent and with a core axis coextensive with the central axis, the heat transfer member being formed with annular exterior fins (28) extending radially from the interior cylindrical core, each exterior fin having parallel faces (30) perpendicular to the central axis spaced by a fin thickness of 0.125 inches plus or minus 10 percent, the fins forming annular parallel spaces (32) perpendicular to the central axis spaced by 0.125 inches plus or minus 10 percent, the fins having radial ends forming the exterior surface of the heat transfer member;
   a handle member (36) constituting a proximal end (16) of the system, the handle member having a gripping surface (38) with a central axis and a length of 4.75 inches plus or minus 10 percent and a maximum diameter of 0.75 inches plus or minus 10 percent, the handle member being formed with an axial recess (40) having a diameter of 0.25 inches plus or minus 10 percent and a length of 3.5 inches plus or minus 10 percent, the handle member including a hole (42) there through remote from the un-threaded axial recess, the handle member being molded of plastic; and
   a coupling member (46) having a cylindrical configuration with a central axis and a diameter of 0.25 inches plus or minus 10 percent and a length, the coupling member being formed with a threaded end (48) removably received in the threaded aperture of the heat transfer member, the threaded end having a length of 0.5 inches plus or minus 10 percent in an axial orientation, the coupling member having an end molded into the recess of the handle member, the coupling member including the rectangular projections being fabricated of metal, the system (100) including the coupling member (146) supporting the heat transfer member (102) at the distal end (116) of the system (100), the heat transfer member having a central axis (106), the heat transfer member also including the core (108) in a cylindrical configuration with an axis coextensive with the central axis, a plurality of similarly configured cylindrical fins 110, each cylindrical fin being formed in an annular configuration supported on the core, each cylindrical fin having an interior cylindrical surface (114) supported on the core, each cylindrical fin having an exterior cylindrical surface (118) concentric with the interior cylindrical surface, each fin having two planar faces (120), a plurality of annular spacings (120) axially spaced along the core by an axial distance D1 parallel with the central axis, the plurality of annular spacings forming a radial depth D2 perpendicular the central axis and extending between the interior and exterior cylindrical surfaces, the radial depth D2 being several times greater than the axial distance D1.

* * * * *

UNITED STATES PATENT AND TRADEMARK OFFICE
CERTIFICATE OF CORRECTION

| | | |
|---|---|---|
| PATENT NO. | : 9,605,911 B1 | Page 1 of 1 |
| APPLICATION NO. | : 13/716679 | |
| DATED | : March 28, 2017 | |
| INVENTOR(S) | : Jack G. Kramer | |

It is certified that error appears in the above-identified patent and that said Letters Patent is hereby corrected as shown below:

On the Title Page

Items (71) and (72) Applicant/Inventor's name is corrected to JACK G. KRAMER

Signed and Sealed this
Eighth Day of August, 2017

Joseph Matal
*Performing the Functions and Duties of the*
*Under Secretary of Commerce for Intellectual Property and*
*Director of the United States Patent and Trademark Office*